United States Patent
Ohnishi et al.

(10) Patent No.: US 9,033,468 B2
(45) Date of Patent: May 19, 2015

(54) ACTUATOR ELEMENT, LIQUID DROP DISCHARGE HEAD, LIQUID DROP DISCHARGE APPARATUS AND IMAGE FORMING APPARATUS

(71) Applicants: Kouji Ohnishi, Hyogo (JP); Takahiko Kuroda, Hyogo (JP); Manabu Nishimura, Hyogo (JP); Kaichi Ueno, Osaka (JP)

(72) Inventors: Kouji Ohnishi, Hyogo (JP); Takahiko Kuroda, Hyogo (JP); Manabu Nishimura, Hyogo (JP); Kaichi Ueno, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/208,004

(22) Filed: Mar. 13, 2014

(65) Prior Publication Data
US 2014/0267506 A1 Sep. 18, 2014

(30) Foreign Application Priority Data

Mar. 15, 2013 (JP) .................................. 2013-054177
Nov. 19, 2013 (JP) .................................. 2013-239005

(51) Int. Cl.
*B41J 2/14* (2006.01)
*B41J 2/045* (2006.01)
*H01L 41/047* (2006.01)

(52) U.S. Cl.
CPC ......... *B41J 2/14201* (2013.01); *H01L 41/0475* (2013.01); *B41J 2/14233* (2013.01); *B41J 2202/11* (2013.01); *B41J 2202/18* (2013.01)

(58) Field of Classification Search
CPC ................... B41J 2002/14491; B41J 2/14072; B41J 2/1623; B41J 2202/20; B41J 2/14024; B41J 2/14129; B41J 2/1631; B41J 2/0458; B41J 2/3351; B41J 2/3354
See application file for complete search history.

(56) References Cited

U.S. PATENT DOCUMENTS

| | | | |
|---|---|---|---|
| 6,568,794 B2 | 5/2003 | Yamanaka et al. | |
| 7,328,981 B2 | 2/2008 | Kuroda | |
| 7,416,281 B2 | 8/2008 | Nishimura et al. | |
| 7,950,770 B2 | 5/2011 | Tokuno et al. | |
| 7,992,969 B2 | 8/2011 | Tanaka et al. | |
| 8,052,249 B2 | 11/2011 | Nishimura et al. | |
| 8,454,133 B2 | 6/2013 | Mizukami et al. | |
| 8,523,330 B2 | 9/2013 | Ueno | |
| 2006/0209136 A1* | 9/2006 | Takahashi | 347/68 |
| 2006/0232638 A1 | 10/2006 | Kuroda et al. | |
| 2008/0043069 A1* | 2/2008 | Shimada et al. | 347/72 |
| 2008/0284825 A1* | 11/2008 | Seto | 347/70 |
| 2012/0206545 A1 | 8/2012 | Kato et al. | |
| 2012/0212545 A1 | 8/2012 | Mizukami et al. | |
| 2012/0229573 A1 | 9/2012 | Mizukami et al. | |
| 2013/0250008 A1 | 9/2013 | Ohnishi et al. | |
| 2013/0250009 A1 | 9/2013 | Ishimori et al. | |

FOREIGN PATENT DOCUMENTS

JP 11-077999 3/1999

* cited by examiner

*Primary Examiner* — Geoffrey Mruk
(74) *Attorney, Agent, or Firm* — Cooper & Dunham LLP

(57) ABSTRACT

An actuator element includes an electrode film; and an insulation film layered on the electrode film including a through hole for connecting a wiring which is formed on the insulation film to the electrode film. A shape of a rim of the through hole is either a closed curve free of corners or a polygon with vertex angles which are larger than 90 degrees.

9 Claims, 12 Drawing Sheets

ACTUATOR ELEMENT, LIQUID DROP DISCHARGE HEAD, LIQUID DROP DISCHARGE APPARATUS AND IMAGE FORMING APPARATUS

BACKGROUND OF THE INVENTION

1. Field of the Invention

The disclosures herein generally relate to an actuator element, a liquid drop discharge head, a liquid drop discharge apparatus and an image forming apparatus, and especially relate to an actuator element including an electromechanical conversion element or an electrothermal conversion element, a liquid drop discharge head including the actuator element, a liquid drop discharge apparatus and an image forming apparatus respectively including the liquid drop discharge head.

2. Description of the Related Art

Some liquid drop discharge heads include a nozzle that discharges liquid drops, a liquid chamber which is in communication with the nozzle and an actuator including an electromechanical conversion element, such as a piezoelectric element, for applying pressure on a liquid in the liquid chamber or an electrothermal conversion element, such as a heater. The actuator element is formed by laminating various thin films, such as an electrode film or a piezoelectric film on a substrate. For example, a piezoelectric element as an electromechanical conversion element has a laminated constitution in which a lower electrode film is formed on a substrate, a piezoelectric film is formed on the lower electrode film, and an upper electrode film formed on the piezoelectric film. For a characteristic of the electrode films, which are formed on both sides of the piezoelectric film, a function on an aspect of the piezoelectric characteristic of the piezoelectric film and a material characteristic to ensure crystallinity and a function on an aspect of an electrical characteristic to transmit a drive signal from an external circuit to the piezoelectric film are required. In order to have the above two functions, the electrode film may be formed to have a laminated structure including two or three layers.

Japanese Published Patent Application No. H11-077999 discloses a recording head of ink-jet type, in which a conductive film (wiring) includes a contact part (through hole for connection) in a plane and runs to side walls of a liquid chamber at least in two directions. In the recording head, when a pattern of the conductive film is formed, stress is received by plural side walls, and stress on a piezoelectric film around the contact part is reduced. Accordingly, an occurrence of a crack or a break in the piezoelectric film due to the stress concentration at the contact part is prevented.

However, in the recording head disclosed by Japanese Published Patent Application No. H11-077999, when a wiring is formed via the through hole for connection in an insulation film formed on an electrode film after the electrode film is formed, interfacial peeling may occur, i.e. the electrode film peels around the through hole for connection in the electrode film. In the case where the electrode film is formed by laminating plural layers, the interfacial peeling may occur between the uppermost layer film, which faces the through hole for connection, and a lower layer film adjacent to the uppermost layer film.

Japanese Published Patent Application H11-077999 discloses a configuration which prevents an occurrence of a crack or a break in the piezoelectric film, but does not describe the problem of the interfacial peeling around the through hole for connection of the electrode film or a configuration to solve the problem.

SUMMARY OF THE INVENTION

It is a general object of at least one embodiment of the present invention to provide an actuator element, a liquid drop discharge head, a liquid drop discharge apparatus and an image forming apparatus that substantially obviate one or more problems caused by the limitations and disadvantages of the related art.

In one embodiment, an actuator element includes an electrode film; and an insulation film layered on the electrode film and including a through hole for connecting a wiring which is formed on the insulation film to the electrode film. A shape of a rim of the through hole is either a closed curve free of corners or a polygon with vertex angles which are larger than 90 degrees.

In another embodiment, a liquid drop discharge head includes an actuator element including an electrode film; and an insulation film layered on the electrode film and including a through hole for connecting a wiring which is formed on the insulation film to the electrode film. A shape of a rim of the through hole is either a closed curve free of corners or a polygon with vertex angles which are larger than 90 degrees.

In yet another embodiment, a liquid drop discharge apparatus includes a liquid drop discharge head including an actuator element, which includes an electrode film; and an insulation film layered on the electrode film and including a through hole for connecting a wiring which is formed on the insulation film to the electrode film. A shape of a rim of the through hole is either a closed curve free of corners or a polygon with vertex angles which are larger than 90 degrees.

In yet another embodiment, an image forming apparatus includes, for a liquid drop discharge head for discharging a liquid drop for forming an image, a liquid drop discharge head including an actuator element, which includes an electrode film; and an insulation film layered on the electrode film and including a through hole for connecting a wiring which is formed on the insulation film to the electrode film. A shape of a rim of the through hole is either a closed curve free of corners or a polygon with vertex angles which are larger than 90 degrees.

According to the present invention, there are an actuator element, a liquid drop discharge head, a liquid drop discharge apparatus and an image forming apparatus, in which an interfacial peeling around a through hole in an electrode film is prevented.

BRIEF DESCRIPTION OF THE DRAWINGS

Other objects and further features of embodiments will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

First Embodiment

Figure 1:
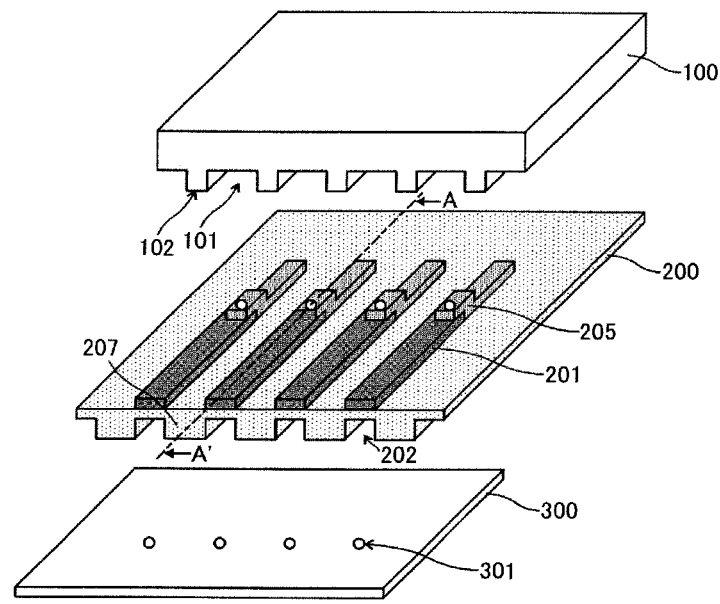
FIG. 1 is an exploded perspective view illustrating a configuration of a main part of a liquid drop discharge head according to a first embodiment of the present invention.
Figure 2:
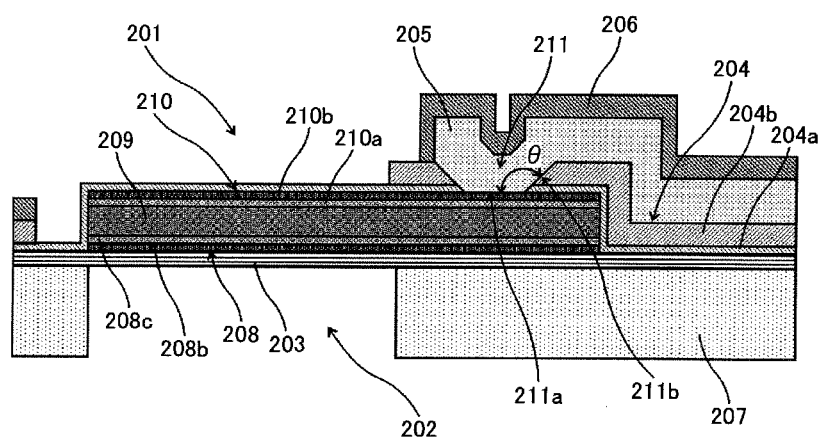
FIG. 2 is a diagram illustrating an example of a partial cross-sectional view on a section A-A' of the liquid drop discharge head shown in FIG. 1.

FIG. 1 is an exploded perspective view of a configuration of a main part of a liquid drop discharge head according to a first embodiment. FIG. 2 is a partial cross-section taken at a line A-A' of the liquid drop discharge head shown in FIG. 1.

As shown in FIG. 1, the liquid drop discharge head according to the present embodiment is formed by joining a sub-frame substrate 100, an actuator substrate 200 and a nozzle substrate 300 with adhesive agent.

On the sub-frame substrate 100, actuator protection cavities 101 and sub-frame joint surfaces are formed on the side of the actuator substrate 200. Moreover, on the sub-frame substrate 100, a liquid provision hole for providing a liquid from outside, an aperture for arranging an electric wiring to outside, a mark for an alignment with the actuator substrate 200, which are not shown in the figures, are formed.

On the actuator substrate 200, actuator elements (piezoelectric element) 201, as electromechanical conversion elements including an electrode film covered with an other electrode film, a piezoelectric film and an interlayer insulation film, are formed on one surface (upper side in FIG. 1). As shown in FIG. 2, the actuator element 201 is formed by laminating an electrode film 208 as a lower electrode, which will be denoted as a "lower electrode film" in the following, a PZT (lead zirconate titanate) film 209 as a piezoelectric film, and an electrode film 210 as an upper electrode, which will be denoted as an "upper electrode film" in the following. The lower electrode film 208 is formed of three layers of a $TiO_2$ (titanium dioxide) film (not shown), a Pt (platinum) film 208b and an SRO (ruthenium strontium, $SrRuO_3$) film 208c. The PZT film 209 is formed in a thin film by a sol-gel method. The upper electrode 210 is formed with a SRO film 210a and a Pt film 210b. On the upper side of the upper electrode film 210, as an interlayer insulation film 204, an $Al_2O_3$ (oxidized aluminum) film 204a and a silicon dioxide film 204b are formed. In a region where the actuator element 201 is deformed or displaced, the silicon dioxide film 204b is removed. Furthermore, a metallic wiring 205 including a conductive material, in order to transmit a signal from an external drive circuit, contacts the Pt film of the upper electrode film 210 via a contact hole 211 as a through hole for connection. Moreover, a passivation protection film 206 is formed for protecting the metallic wiring 205. Moreover, on the other side of the actuator substrate 200 (lower side in FIG. 1), liquid chambers 202 and partition walls 207 are formed.

As shown in FIG. 1, in the nozzle substrate 300, nozzles 301 as liquid drop discharge holes, farmed by the press work method, the nickel (Ni) electroforming method or the like, are arranged. The nozzle substrate 300 is joined with an adhesive agent to the surface of the actuator substrate 200 on the side of the liquid chambers 202.

In the liquid drop discharge head as described above, a drive signal (electric signal) input from an external driving circuit, which is not shown, is transmitted by the metallic wiring 205, via the contact hole 211, to be applied on the actuator element 201. By the drive signal, the actuator element 201 deforms, which displaces a surface of a vibration plate 203, and pressure is generated on a liquid in the liquid chamber 202. According to the pressure generated on the liquid in the liquid chamber 202, a desired amount of liquid drops can be discharged from the nozzle 301.

Next, a shape of the contact hole 211 in the liquid drop discharge head according to the present embodiment will be explained in the following.

Figure 3:
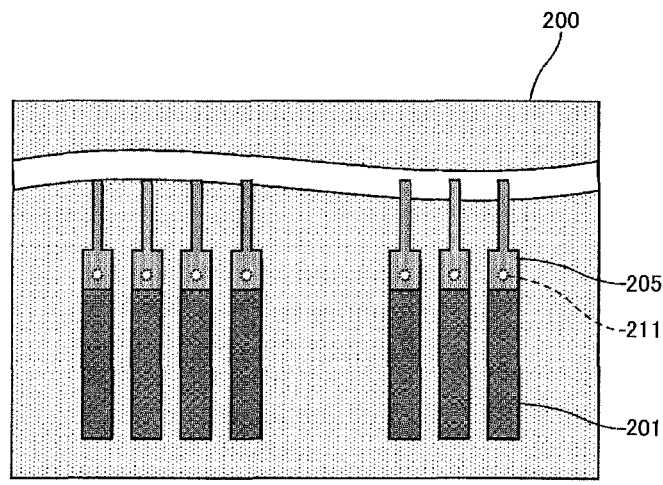
FIG. 3 is a top view of an actuator substrate included in the liquid drop discharge head according to the present embodiment.

FIG. 3 is a top view of the actuator substrate 200 included in the liquid drop discharge head according to the present embodiment. As shown in FIGS. 2 and 3, at an end in a longitudinal direction of the actuator element 201, a contact hole 211 as the through hole for connection is formed in the interlayer insulation film 204. Via the contact hole 211, the metallic wiring 205 and the upper electrode film 210 of the actuator element 201 are electrically connected. After the metallic wiring 205 is formed in this way, a passivation protection film 206 is formed in order to protect the metallic wiring 205. The metallic wiring 205 has a higher coefficient of thermal expansion than those of the interlayer insulation film 204 and the PZT film 209 around the metallic wiring 205. Accordingly, when a heat treatment is performed in the process of forming the passivation protection film 206, the metallic wiring 205 in the contact hole 211 extends along a direction of the surface. The extension of the metallic wiring along the direction of the surface is regulated by a rim of the contact hole 211 on the interlayer insulation film 204, the coefficient of thermal expansion of which is lower than that of the metallic wiring 205. Accordingly, if a shape of the rim of the contact hole 211 has a corner, a stress concentration occurs in the metallic wiring 205 at the corner. The Pt film 210b, which is the upper layer of the upper electrode film 210, is in close contact with the metallic wiring 205, and is substantially thin compared with the metallic wiring 205. Accordingly, the Pt film extends with the metallic wiring 205, and a stress concentration occurs at the corner of the contact hole 211 in the same way as that of the metallic wiring 205. On the other hand, the Sr film 210a, which is the lower layer of the upper electrode film, is in close contact with the PZT film 209, the coefficient of thermal expansion of which is less than that of the metallic wiring 205. The Sr film is substantially thin compared with the PZT film 209, and moves following the PZT film side. Under the above circumstance, at the corner of the contact hole 211, a shearing stress occurs between the Pt film 210b, in which the stress concentration occurs, and the Sr film 210a on the side of the PZT film 209 below the Pt film, and peeling may occur at the interface between the Pt film 210b and the Sr film 210a.

In the present embodiment, in order to prevent the occurrence of the stress concentration which may cause the interfacial peeling between the Pt film 210b and the Sr film 210a, the shape of the rim of the contact hole 211 is a polygon with vertex angles which are larger than 90 degrees, or a closed curve free of corners.

Figure 4:
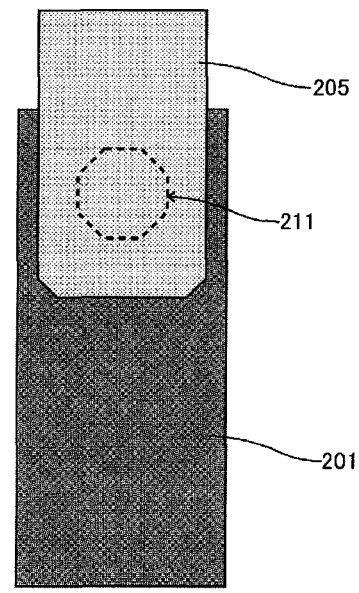
FIG. 4 is an enlarged view illustrating an example of a contact hole in the actuator substrate according to the present embodiment.

FIG. 4 is an enlarged view of an example of the contact hole 211 of the actuator 200. In FIG. 4, the shape of the rim of the contact hole 211 in the surface direction, which is orthogonal to the thickness direction, is an octagon. The vertex angle of the octagon is an obtuse angle, larger than 90 degrees. At a vertex portion the stress concentration hardly occurs, and the interfacial peeling between the Pt film 210b and the Sr film 210a due to the stress concentration can be prevented.

On the other hand, if the contact hole 211 is formed with the rim shape of a tetragon or having a corner of an acute angle, the stress concentration may occur at the corner, and the interfacial peeling between the PT film 210b and the Sr film 210a due to the stress concentration occurs.

Meanwhile, FIG. 4 shows an example where the rim shape of the contact hole 211 is an octagon. The rim shape of the contact hole 211 may be a pentagon, a hexagon or a heptagon, or a polygon such as a nonagon or a decagon having vertex portions, the number of which are more than or equal to nine.

Figure 5:
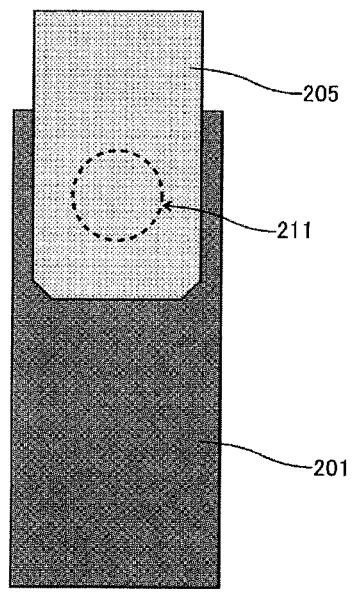
FIG. 5 is an enlarged view illustrating another example of the contact hole in the actuator substrate according to the present embodiment.

FIG. 5 is an enlarged view of another example of the contact hole 211 of the actuator 200. The rim shape of the contact hole 211 in the surface direction, which is orthogonal to the thickness direction, is a circle. The circular shape is free of corners, so that the stress concentration as above hardly occurs. The interfacial peeling between the Pt film 210b and the Sr film 210a due to the stress concentration can be prevented.

Moreover, in the present embodiment, as shown in FIG. 2, an angle between a flat surface on which the upper electrode film 210 contacts the metallic wiring 205 and a side face on which the interlayer insulation film 204 contacts the metallic wiring 205 in the contact hole is larger than 90 degrees. That is, the cross section of the contact hole 211 taken along a plane parallel to the thickness direction has a first straight line segment 211a of intersection between the cross section and a flat surface on which the upper electrode film 210 contacts the metallic wiring 205 and a second straight line segment 211b of intersection between the cross section and a side face on which the interlayer insulation film 204 contacts the metallic wiring 205 in the contact hole 211, wherein the angle θ between the first straight line segment and the second straight line segment is larger than 90 degrees. The angle θ is, for example, preferably larger than or equal to 100 degrees and less than or equal to 120 degrees. In this way, since the cross section of the contact hole 211 has a tapered shape, the stress concentration hardly occurs. That is, when the metallic wiring 205 extends into the contact hole 211, a stress occurring at a corner portion of the contact hole 211 can be transferred along a tilted side face (slope) of the contact hole 211, and the stress concentration hardly occurs. Accordingly, the occurrence of stress concentration can be certainly suppressed, and the interfacial peeling between the Pt film 210b and the Sr film 210a can be prevented.

Figure 6:
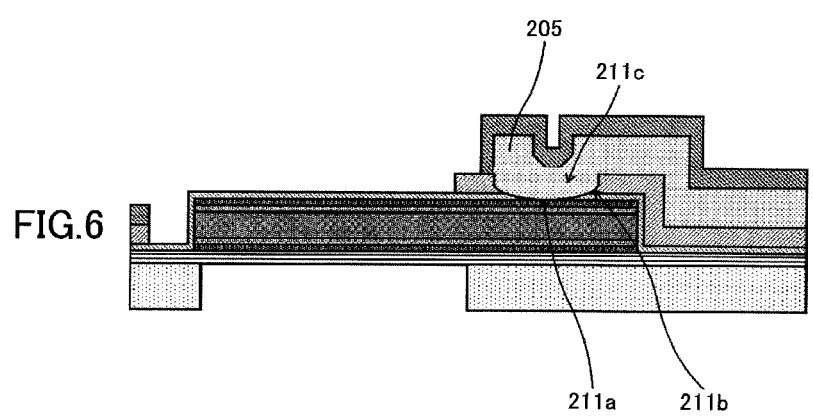
FIG. 6 is a diagram illustrating another example of the cross-sectional shape of the contact hole according to the present embodiment.

Meanwhile, in the present embodiment, as shown in FIG. 2, the cross section of the contact hole taken along a plane parallel to the thickness direction has a tapered shape. However, the present embodiment is not limited to the above example. As shown in FIG. 6, for example, the cross section of the metallic wiring 205 may have a continuous circular arc curve 211c on which the metallic wiring 205 contacts the upper electrode film 210 and the interlayer insulation film 204.

Next, with reference to FIGS. 7 to 21, an example of a method of manufacturing the actuator substrate 200 of the liquid drop discharge head according to the embodiment of the present invention will be described.

Figure 7:
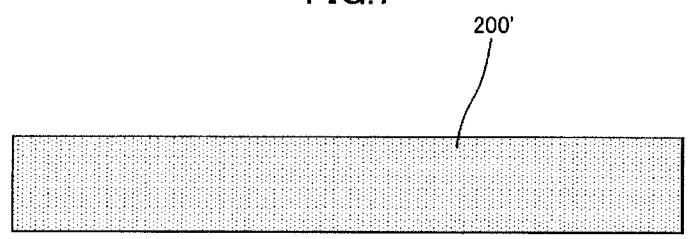
FIG. 7 is a diagram illustrating an example of a silicon substrate which is a base of the actuator substrate according to the present embodiment.
Figure 8:
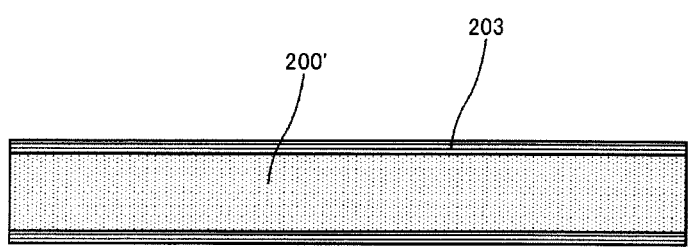
FIG. 8 is an explanatory diagram illustrating a process of forming a vibration plate according to the present embodiment.

At first, as shown in FIGS. 7 and 8, on a silicon substrate 200', which is a base of the actuator substrate 200, a vibration plate 203 is formed. The vibration plate 203 is formed by laminating in series a silicon dioxide films by thermal oxidation, a silicon nitride film by the LPCVD (Low Pressure Chemical Vapor Deposition) method, a silicon dioxide film and a poly-silicon film.

Figure 9:
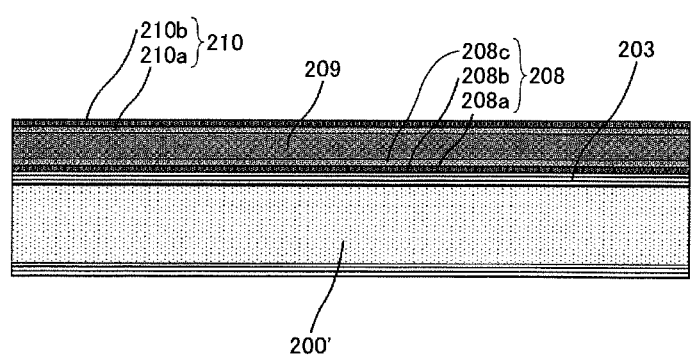
FIG. 9 is an explanatory diagram illustrating a process of forming an electrode film and a PZT (Lead Zirconate Titanate) film according to the present embodiment.

Next, as shown in FIG. 9, on the vibration plate, as the lower electrode film 208, a TiO2 film 208a, a Pt film 208b, and an SRO film 208c are laminated in series by the sputtering method. Then, as the piezoelectric film, a PZT film is formed by repeating spin coating and heating by the sol-gel method. Furthermore, as the upper electrode film 210, an SRO film 210a and a Pt film 210b are formed in series.

Figure 10:
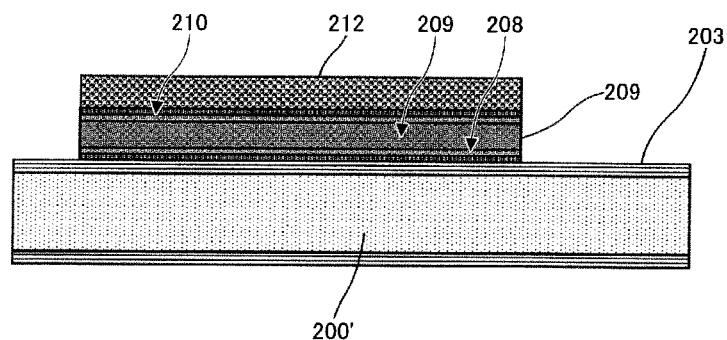
FIG. 10 is an explanatory diagram illustrating a process of performing patterning on the electrode film and the PZT film according to the present embodiment.

Next, as shown in FIG. 10, a desired pattern is formed by the lithography method and the etching method using a resist pattern 212 for the upper electrode film 210, the PZT film 209 and the lower electrode film 208, which are formed by laminating.

Figure 11:
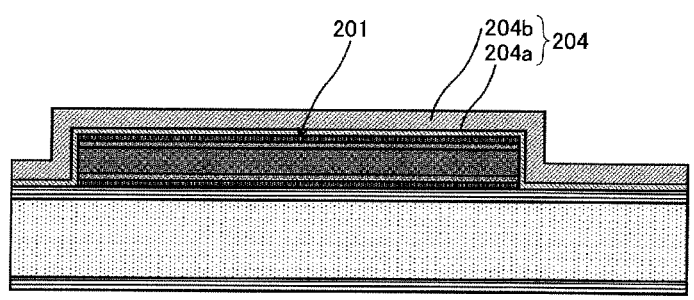
FIG. 11 is an explanatory diagram illustrating a process of forming an interlayer insulation film according to the present embodiment.

Next, as shown in FIG. 11, on the actuator element 201, for which the desired pattern is formed, an interlayer insulation film 204 is formed. The interlayer insulation film 204 is formed by laminating in series an Al$_2$O$_3$ film 204a by the vapor deposition method for the lower layer and a silicon dioxide film 204b by the CVD (Chemical Vapor Deposition) method for the upper layer.

Figure 12:
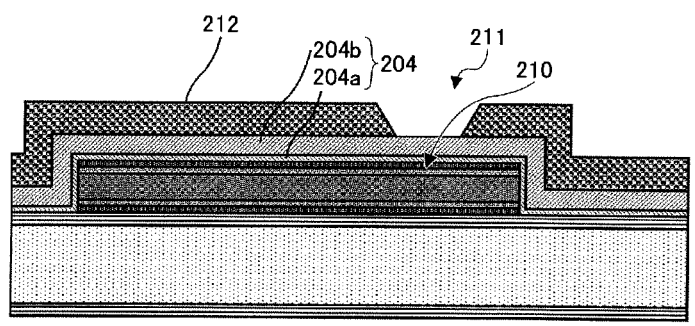
FIG. 12 is an explanatory diagram illustrating an example of a process of forming a contact hole according to the present embodiment.
Figure 13:
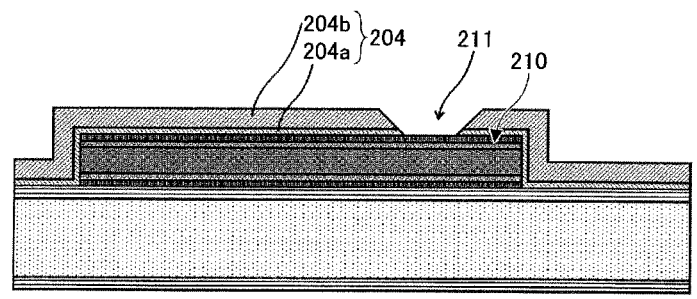
FIG. 13 is an explanatory diagram illustrating the example of the process of forming a contact hole according to the present embodiment.

Next, as shown in FIGS. 12 and 13, a contact hole 211 as a through hole for connection, by which the upper electrode film 210 contacts the metallic wiring 205, is formed. Meanwhile, in FIG. 13, an illustration of a similar contact hole for the lower electrode film 208 is omitted.

A resist pattern 212 for forming the contact hole 211 is formed to have a tapered shape, and the contact hole 211 is formed in accordance with the shape, i.e. the cross section of the contact hole 211 has a tapered shape. Forming the resist pattern 212 to have the tapered shape can be performed by a generally known curing treatment for a resist.

Moreover, the shape of the rim portion of the contact hole 211 in the surface direction, which is an octagon or a circle in the above example, can be formed by a mask pattern. The size of a side or a diameter is, for example, in a range from 10 μm to 50 μm.

Figure 14:
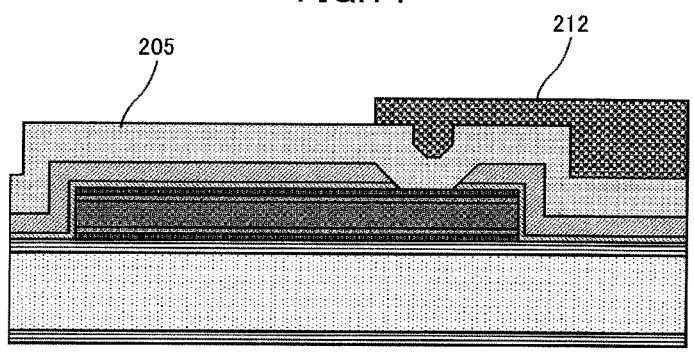
FIG. 14 is an explanatory diagram illustrating an example of a process of forming a metallic wiring according to the present embodiment.
Figure 15:
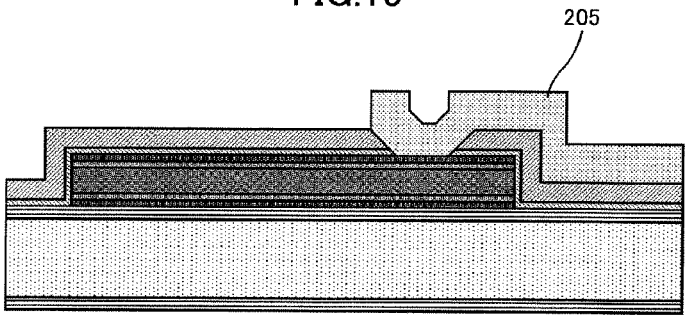
FIG. 15 is an explanatory diagram illustrating the example of the process of forming the metallic wiring according to the present embodiment.

Next, as shown in FIGS. 14 and 15, a metallic wiring 205 having a predetermined pattern is formed using the resist pattern 212. The metallic wiring 205 is formed to have a laminated configuration of titanium nitride (TiN) and aluminum (Al). Since the metallic wiring 205 in the contact hole 211 is formed in accordance with the tapered shape of the contact hole 211, the stress concentration in the upper electrode film 210 of the lower layer (SRO film 210a) can be relieved.

Figure 16:
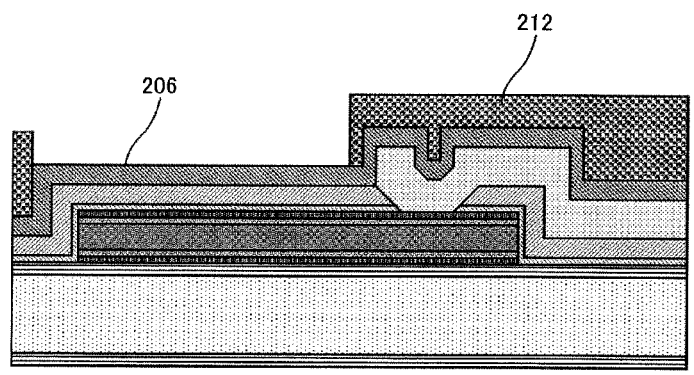
FIG. 16 is an explanatory diagram illustrating an example of a process of forming a passivation protection film according to the present embodiment.
Figure 17:
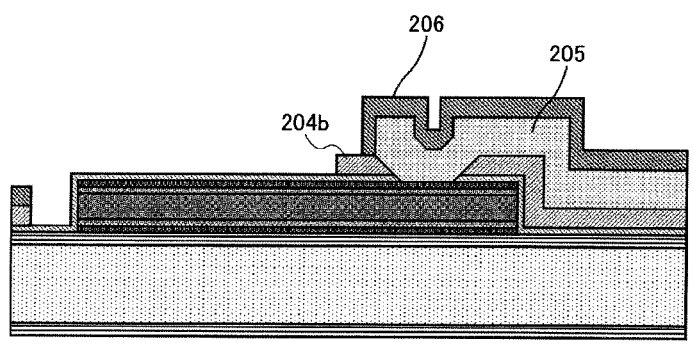
FIG. 17 is an explanatory diagram illustrating the example of the process of forming the passivation protection film according to the present embodiment.

Next, as shown in FIGS. 16 and 17, a passivation protection film 206 is formed on the metallic wiring 205 using the resist pattern 212. In the passivation protection film 206, a silicon nitride film is formed by the CVD method. Moreover, the passivation protection film 206 on the actuator element 201 and the silicon dioxide film 204b on the interlayer insulation film 204 are inhibitions of the actuator 201, and removed by the lithography method and the etching method.

Figure 18:
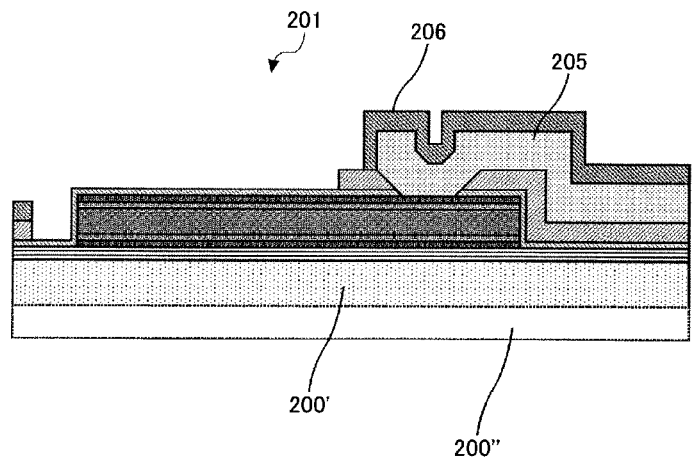
FIG. 18 is an explanatory diagram illustrating a process of polishing before forming a liquid chamber according to the present embodiment.

Next, as shown in FIG. 18, in order to form a liquid chamber 202 on the opposite side of the actuator element 201, an unnecessary part 200" of the substrate is polished by a polishing processing, and the substrate 200' is processed to have a desired thickness. In FIG. 18, the substrate 200' with a thickness of 75 μm remains to establish a height of the liquid chamber 202.

Figure 19:
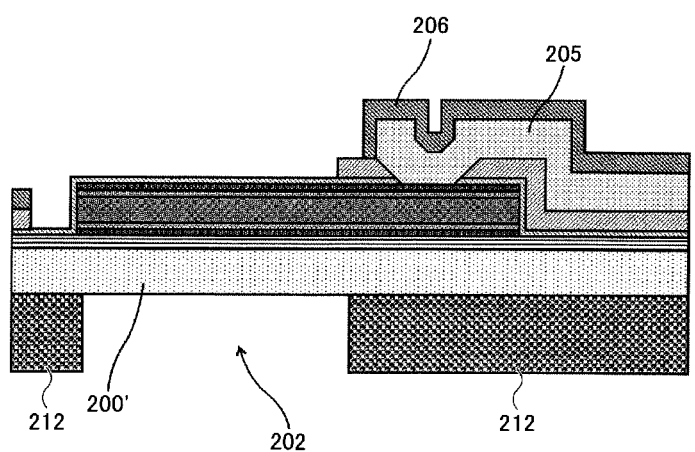
FIG. 19 is an explanatory diagram illustrating an example of a process of forming the liquid chamber according to the present embodiment.
Figure 20:
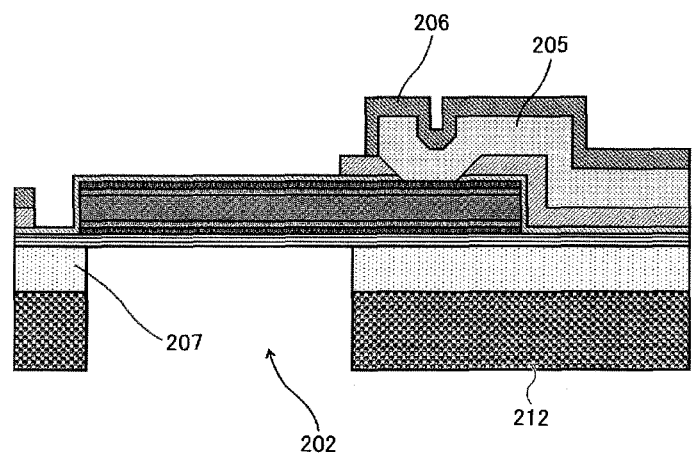
FIG. 20 is an explanatory diagram illustrating the example of the process of forming the liquid chamber according to the present embodiment.

Next, as shown in FIGS. 19 and 20, the resist pattern 212 is formed in order to form the liquid chamber 202, and the liquid chamber 202 is formed by the dry etching.

Figure 21:
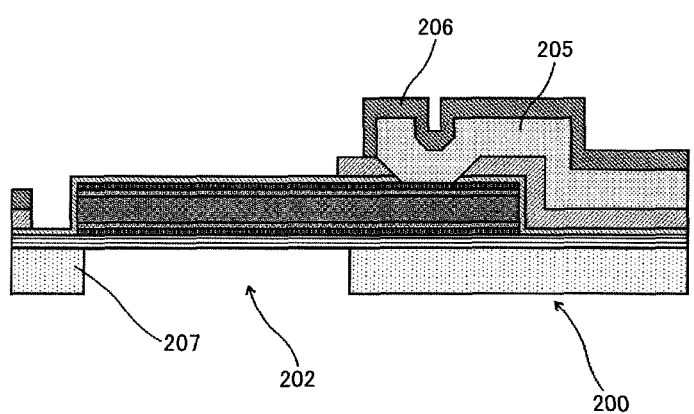
FIG. 21 is a cross-sectional view of an example of the actuator substrate according to the present embodiment.

According to the above processes, the actuator substrate 200 is formed as shown in FIG. 21.

Meanwhile, a liquid drop discharge head according to the present embodiment further includes liquid provision holes for providing a liquid from outside or the like. An explanation for them is omitted.

Figure 22:
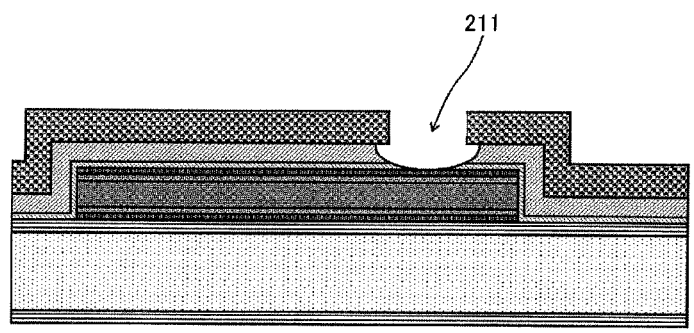
FIG. 22 is an explanatory diagram illustrating a process of forming a contact hole having a side surface with an arc-like cross-section according to the present embodiment.

Moreover, in the process of forming the contact hole 211, shown in FIGS. 12 and 13, the shape of the resist is a tapered shape and the contact hole 211 is formed in accordance with the shape of the resist by anisotropic etching to have a tapered shape. However, the present embodiment is not limited to the above method. For example, as shown in FIG. 22, the contact hole 211 may be formed to have a round shape by isotropic etching such as wet etching.

Next, an example of an image forming apparatus as a liquid drop discharge apparatus including the liquid drop discharge head according to the embodiment of the present invention will be explained.

Figure 23:
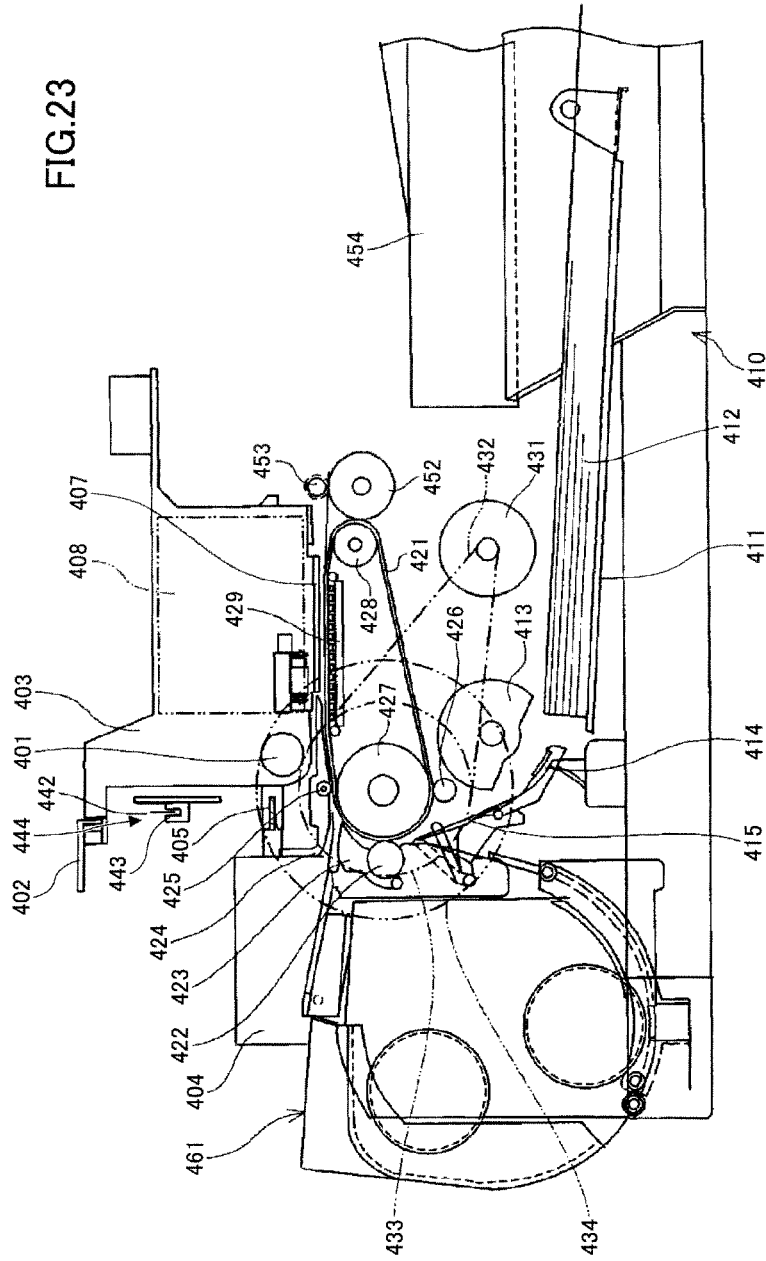
FIG. 23 is a side view illustrating an example of an entire configuration of an image forming apparatus according to the present embodiment.
Figure 24:
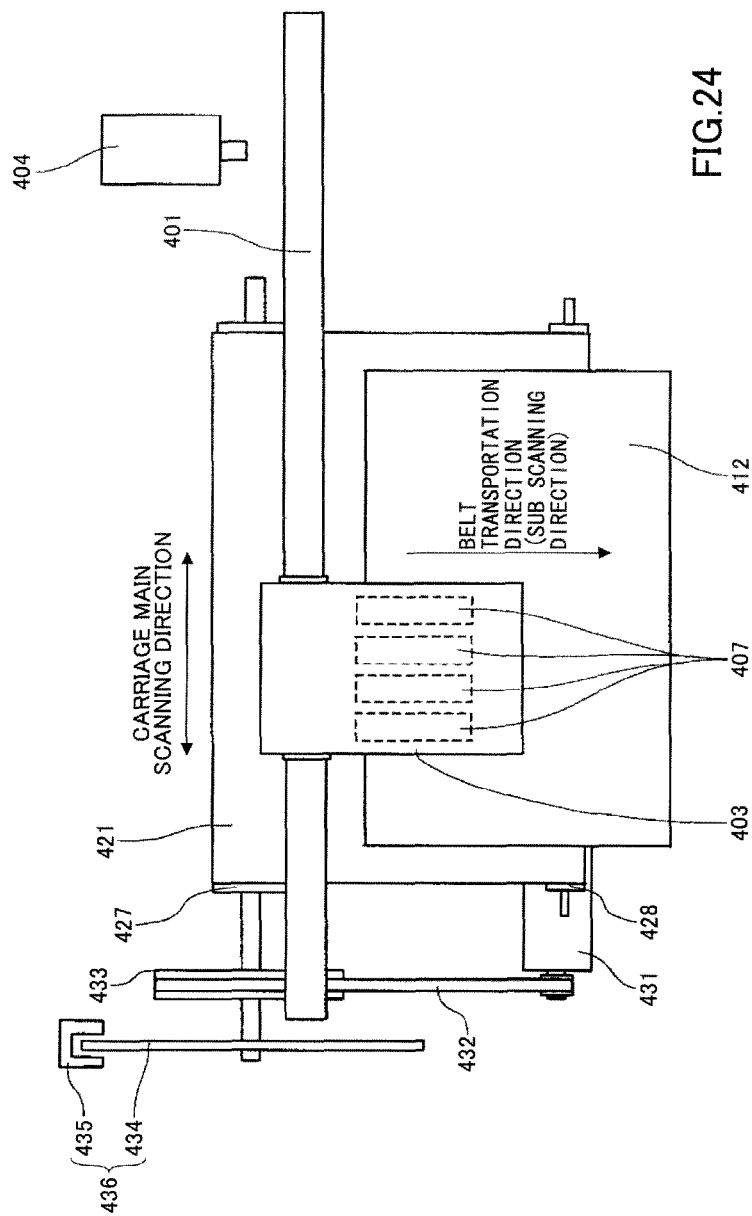
FIG. 24 is a plan view illustrating an example of a configuration of a main part of the image forming apparatus according to the present embodiment.

FIG. 23 is a side view illustrating an example of an entire configuration of the image forming apparatus according to the present embodiment. FIG. 24 is a plan view illustrating a configuration of a main part of the image forming apparatus according to the present embodiment.

The image forming apparatus according to the present embodiment holds a carriage 403 slidably in a main scanning direction by a guide rod 401 and a guide rail 402, which are guide members bridging laterally to left and right side plates (not shown). The carriage 403 moves and scans in the direction, indicated by the arrow in FIG. 24 (main scanning direction), by a main scanning motor 404 via a timing belt 405.

The carriage 403, for example, is provided with four liquid drop discharge heads 407, which discharge liquid drops for image formation of colors of yellow (Y), cyan (C), magenta (M) and black (Bk), respectively. Each of the liquid drop discharge heads 407 is arranged so that an array of plural nozzles, as liquid drop discharge ports, crosses the main scanning direction and the liquid drop discharge ports are directed downward. The liquid drop discharge head 407 includes the actuator element such as the piezoelectric element, as described above.

The carriage 403 is provided with sub reservoirs 408 to provide liquids of respective colors to the liquid drop discharge heads 407. To fill the sub reservoir 408, via a liquid providing tube (not shown), a liquid is provided from a main reservoir (liquid cartridge). Meanwhile, the carriage 403 may be provided with a main reservoir without the sub reservoirs.

Moreover, the image forming apparatus according to the present embodiment includes a paper feed unit that feeds a paper 412 as a recording medium, which is loaded on a paper load unit (pressure plate) 411, such as a paper feed cassette 410. The paper feed unit includes a semicircular roll (paper feed roller) 413, which feeds papers 412 one by one from the paper load unit 411, a separation pad 414, which is opposed to the paper feed roller 413 and includes a material with a high coefficient of friction. The separation pad is biased toward the side of the paper feed roller 413.

Moreover, the image forming apparatus according to the present embodiment includes a transportation unit that transports the paper 412 fed from the paper feed unit to a lower side of the liquid drop discharge head 407. The transportation unit includes a transportation belt 421 which electrostatically attracts and transports the paper 412, and a counter roller 422 which holds the paper 412, sent from the paper feed unit via a guide 415, with the transportation belt 421 and transports the paper. Furthermore, the transportation unit includes a transportation guide 423 which changes a transportation direction of the paper 412 sent upward in an approximately vertical direction by approximately 90 degrees, and causes the paper 412 to follow the transportation belt 421, and a tip pressure roll 425 which is biased toward the side of the transportation belt 421 by a hold member 424. Moreover, the transportation unit includes a charge roller 426 as a charge unit that charges a surface of the transfer belt 421.

The transportation belt 421 which is an endless belt is circulated around a transportation roller 427 and a tension roller 428. Moreover, the transportation belt 421 is configured so as to move around in a belt transportation direction (sub scanning direction) as shown in FIG. 24 according to the rotation of the transportation roller 427 by a sub scanning motor 431 via a timing belt 432 and a timing roller 433. Meanwhile, on the back side of the transportation belt 421, a guide member 429 is arranged corresponding to an image forming region by the liquid drop discharge head 407.

Moreover, as shown in FIG. 24, a slit disk 434 is attached to the axle of the transportation roller 427. Moreover, the image forming apparatus includes a sensor 435 that detects a slit of the slit disk 434. The encoder 436 includes the slit disk 434 and the sensor 435.

The charge roller 426 is arranged so as to contact a surface layer of the transportation belt 421 and rotate following the movement of the transportation belt 421. On both ends of the axle of the charge roller 426 forces of 2.5 N are applied.

Moreover, anterior to the carriage 403, as shown in FIG. 23, an encoder scale 442 is provided in which a slit is formed. On the front side of the carriage 403, an encoder sensor 443 including a transmission type photo sensor which detects a slit of the encoder scale 442, is arranged. According to the above configurations, an encoder 444 for detecting a position of the carriage 403 in the main scanning direction (position with respect to the home position) is configured.

Furthermore, the image forming apparatus according to the present embodiment includes a paper ejection unit for ejecting the paper 412 on which an image is formed by the liquid drop discharge head 407. The paper ejection unit includes a separation unit that separates the paper 412 from the transportation unit 421, a paper ejection roller 452, a paper ejection roll 453 and a paper ejection tray 454 on which the ejected papers 412 are stacked.

Moreover, on the back side of the image forming apparatus, a double-sided paper feed unit 461 is arranged detachably. The double-sided paper feed unit 461 imports the paper 412 to be returned by an inverse rotation of the transportation belt 421, reverses the paper 412, and feeds the paper 912 between the counter roller 422 and the transportation belt 421 again.

In the image formation apparatus as described above, papers 412 are fed from the paper feed unit one by one, the paper 412 fed upward in an approximately vertical direction is guided by the guide 415, and the paper 412 is held between the transportation belt 421 and the counter roller 422 and transported. Furthermore, a front end of the paper 912 is guided by the transportation guide 423 and is pressed to the transportation belt by the tip pressure roll 425, and the transportation direction is changed by about 90 degrees.

Then, by a control circuit which is not shown, from a high voltage power supply an alternate voltage, in which a positive output and a negative output are repeated alternately, is applied on the charge roller 426. Accordingly, the transportation belt 421 is charged in an alternate charge voltage pattern, i.e. a positively charged band with a predetermined width and a negatively charged band with the predetermined width are repeated in the sub scanning direction which is the rotation direction. When the paper 412 is fed to the transportation belt 421 which is alternately charged positively and negatively, the paper 412 is electrostatically attracted to the transportation belt 421, and the paper 412 is transported in the sub scanning direction by the rotational movement of the transportation belt 421.

In the image forming apparatus according to the present embodiment, the liquid drop discharge head 407 is driven based on an image signal while moving the carriage 403. Accordingly, the liquid drop discharge head 407 discharges liquid drops onto the paper 412, which is at rest, and forms an image of one line; and after the transportation by a predetermined amount, forms an image of the next line. By receiving a record end signal or a signal indicating that a back end of the paper 412 reaches the image forming region, the operation of forming an image ends, and the paper 412 is ejected onto the paper ejection tray 454.

Moreover, in the case of the double-sided printing, when the image forming on the front surface, on which an image is formed first, ends, the transportation belt 421 is rotated in reverse. Accordingly, the paper on which the image is formed is input to the double-sided paper feed unit 461, the paper 412 is reversed, i.e. the back surface becomes an image forming surface, and the paper 412 is fed again between the counter roller 422 and the transportation belt 421. Then timing is controlled, the paper 412 is transported on the transportation belt 421, an image is formed on the back surface, and the paper 412 is ejected onto the paper ejection tray 454.

The image forming apparatus according to the present invention can be applied to a printer, a facsimile apparatus, a copy apparatus, a multifunction apparatus of them, or the like. Moreover, the present invention can be applied to a liquid drop discharge head which discharges a liquid other than the liquid for image forming (ink), for example, a DNA reagent, a resist, a pattern material or the like, and to a liquid drop discharge device including the liquid drop discharge head.

The embodiment is an example by which particular effects can be achieved for the following aspects, respectively.

(Aspect A)

An electrode film, such as the upper electrode film 210 and an insulation film layered on the electrode film, such as the interlayer insulation film 204 having a through hole, such as the contact hole 211 for connecting a wiring which is formed on the insulation film to the electrode film, are provided. A shape of a rim of the through hole is a polygon with vertex angles which are larger than 90 degrees, or a closed curve free of corners.

According to the above feature, as explained in the above embodiment, a stress concentration on the electrode film around the rim of the through hole is relieved, and an occurrence of interfacial peeling of the electrode film due to the stress concentration can be prevented.

(Aspect B)

In the above aspect A, the shape of the rim of the through hole is an octagon. According to this feature, as explained in the above embodiment, the stress concentration on the electrode film around corner portions of the rim including the octagon of the through hole is relieved, and the occurrence of the interfacial peeling of the electrode film due to the stress concentration can be prevented.

(Aspect C)

In the above aspect A, the shape of the rim of the through hole is a circle. According to this feature, as explained in the above embodiment, the stress concentration on the electrode film around the rim including the circle of the through hole is relieved, and the occurrence of the interfacial peeling of the electrode film due to the stress concentration can be prevented.

(Aspect D)

In any of the aspects A to C, an angle between a flat surface on which the electrode film contacts the wiring and a side face on which the insulation film contacts the wiring in the through hole is larger than 90 degrees. According to this feature, as explained in the above embodiment, the stress concentration on the electrode film can be relieved, and the occurrence of the interfacial peeling of the electrode film can be prevented.

(Aspect E)

in any of the aspects A to C, a cross section of the wiring in the through hole taken along a plane parallel to the thickness direction has a continuous circular arc curve on which the wiring contacts the electrode film and the insulation film. According to this feature, as explained in the above embodiment, the stress concentration on the electrode film can be relieved, and the occurrence of the interfacial peeling of the electrode film can be prevented.

(Aspect F)

In any of the aspects A to E, the electrode film includes layers, a number of which is larger than or equal to two. According to this feature, as explained in the above embodiment, an occurrence of interfacial peeling at an interface between layers of the electrode film can be prevented.

(Aspect G)

In any of the aspects A to F, the electrode film includes an electrode of an electromechanical conversion element. According to this feature, as explained in the above embodiment, an occurrence of interfacial peeling at the electrode film of the electromechanical conversion element due to the stress concentration can be prevented.

(Aspect H)

A liquid drop discharge head including the actuator element of any of the aspects A to G. According to this feature, as explained in the above embodiment, reliability in driving by applying a signal via the electrode film in the liquid drop discharge head can be enhanced.

(Aspect I)

A liquid drop discharge apparatus includes the liquid drop discharge head of aspect H. According to this feature, as explained in the above embodiment, reliability in the driving by applying a signal via the electrode film in the liquid drop discharge apparatus can be enhanced.

(Aspect J)

An image forming apparatus includes the liquid drop discharge head of aspect H as a liquid drop discharge head for discharging liquid drops for image formation. According to this feature, as explained in the above embodiment, reliability in the driving by applying a signal via the electrode film in the image forming apparatus can be enhanced.

Further, the present invention is not limited to embodiments, but various variations and modifications may be made without departing from the scope of the present invention.

The present application is based on and claims the benefit of priorities of Japanese Priority Applications No. 2013-054177 filed on Mar. 15, 2013 and No. 2013-239005 filed on Nov. 19, 2013 with the Japanese Patent Office, the entire contents of which are hereby incorporated by reference.

What is claimed is:

1. An actuator element, comprising:
an electrode film; and
an insulation film layered on the electrode film and including a through hole for connecting a wiring which is formed on the insulation film to the electrode film, a shape of a rim of the through hole being a polygon with vertex angles which are larger than 90 degrees.

2. The actuator element as claimed in claim 1, wherein the shape of the rim of the through hole is an octagon.

3. The actuator element as claimed in claim 1, wherein a cross section of the wiring in the through hole taken along a plane parallel to an actuator element thickness direction includes a first straight line segment of intersection in the cross section that is a flat surface on which the electrode film contacts the wiring in the through hole and a second straight line segment of intersection in the cross section that is a side face on which the insulating film contacts the wiring in the through hole, an angle between the first straight line segment and the second straight line segment being larger than 90 degrees.

4. The actuator element as claimed in claim 1, wherein a cross section of the wiring in the through hole taken along a plane parallel to a thickness direction has a continuous circular arc curve on which the wiring contacts the electrode film and the insulation film.

5. The actuator element as claimed in claim 1, wherein the electrode film includes layers, a number of which is larger than or equal to two.

6. The actuator element as claimed in claim 1, wherein the electrode film includes an electrode of an electromechanical conversion element.

7. A liquid drop discharge head, comprising the actuator element as claimed in claim 1.

8. A liquid drop discharge apparatus, comprising the liquid drop discharge head as claimed in claim 7.

9. An image forming apparatus, comprising the liquid drop discharge head as claimed in claim 7 for a liquid drop discharge head for discharging a liquid drop for forming an image.

* * * * *